United States Patent [19]

Benzoni

[11] Patent Number: 5,328,552
[45] Date of Patent: Jul. 12, 1994

[54] LEADFRAME PROCESSING FOR MOLDED PACKAGE ARRANGEMENTS

[75] Inventor: Albert M. Benzoni, Lower Macungie Township, Lehigh County, Pa.

[73] Assignee: AT&T Bell Laboratories, Murray Hill, N.J.

[21] Appl. No.: 40,235

[22] Filed: Mar. 30, 1993

[51] Int. Cl.⁵ .......................... B44C 1/22; C23F 1/00
[52] U.S. Cl. ............................. 156/630; 156/645; 156/634; 156/656; 156/902; 437/220; 437/224
[58] Field of Search ............... 156/631, 634, 645, 656, 156/659.1, 664, 901, 902; 437/182, 207, 206, 211, 217, 219, 220, 224, 228, 245; 29/827; 264/272.11, 272.17; 357/72

[56] References Cited

U.S. PATENT DOCUMENTS 4,410,469  10/1983  Katagiri et al. ........................ 264/1.5
4,911,519   3/1990  Burton et al. ........................ 350/96.20
5,026,669   6/1991  Shinohara ............................ 437/224

*Primary Examiner*—William Powell
*Attorney, Agent, or Firm*—Wendy W. Koba

[57] ABSTRACT

A method for processing a leadframe for use with a molded package is disclosed. In particular, the method is suited for arrangements where direct wirebond attachment sites are exposed through the molding material. Conventional molding processes usually result in leaving a residue of molding material on the exposed wirebond sites. The invention is directed to including a protective layer of material over the wirebond locations during the leadframe plating operation. The protective layer (and any molding residue covering the protective layer) may then be removed using an etchant after the molding operation, exposing the underlying wirebond contact sites.

4 Claims, 2 Drawing Sheets

LEADFRAME PROCESSING FOR MOLDED PACKAGE ARRANGEMENTS

BACKGROUND OF THE INVENTION

1. Technical Field

The present invention relates to leadframe processing and, more particularly, to a leadframe metallization technique useful in molded packaging arrangements.

2. Description of the Prior Art

In many current integrated electronic and/or optoelectronic circuit arrangements, one or more semiconductor components are positioned on a leadframe and encased in a package so as to form, for example, a single in-line package (SIP) or dual in-line package (DIP) structure. The package may be, in some cases, molded from a plastic to completely encase the circuit components. Typically, electrical signals are transmitted to/from such a molded package to an associated circuit board by a plurality of leads which comprise the package leadframe structure. However, in some cases, the need arises to provide a direct electrical contact between the molded package and another device without passing the connection through the circuit board (e.g., in situations where the signal degradation associated with the circuit board is unacceptable).

A problem with the direct wirebond connection is that an essentially clean wirebond contact on the molded package is required to provide the necessary electrical and mechanical integrity. However, inherent in the molding operation is the residue and/or bleed of molding compound, a resin, which will adhere to the exposed wirebond surface. Conventional cleaning agents, which may be capable of removing the resin from the exposed gold wirebond pad sites, are not acceptable alternatives since they have been found to attack the molded plastic package and/or gold wirebond contact, as well as require a one-at-a-time cleaning process (costly as compared to a "batch" cleaning system).

A need remains, therefore, for a method of improving the electrical quality of wirebond attachments to leadframes utilized in molded packaging arrangements.

SUMMARY OF THE INVENTION

The need remaining in the prior art is addressed by the present invention which relates to leadframe processing and, more particularly, to a leadframe metallization technique useful in molded packaging arrangements.

In accordance with an exemplary embodiment of the present invention, a conventional copper leadframe (prior to the molding operation) is blanket plated with nickel, then selectively (in wirebond locations) plated with gold. The gold-plated areas are subsequently plated with a protective material (for example, copper). The structure is then molded, using any desired molding process (typically, a transfer molded process), resulting a portion of the molding resin covering the wirebond sites. After molding, the structure is exposed to an etchant which is chosen such that only the protective layer (and resin coating) is removed. Therefore, the underlying leadframe and the virgin gold contact areas of the wirebond sites are exposed.

In one method of performing the present invention, copper may be used as the protective material, where an etchant comprising approximately 10% ammonium hydroxide and 10% HCl may be used.

It is an advantage of the present invention that various combinations of protective materials and etchants may be used to provide for the protection of the gold wirebond contact.

Other and further advantages of the present invention will become apparent during the course of the following discussion and by reference to the accompanying drawings.

BRIEF DESCRIPTION OF THE DRAWING

Referring now to the drawings, where like numerals represent like parts in several views.

DETAILED DESCRIPTION

Figure 1:
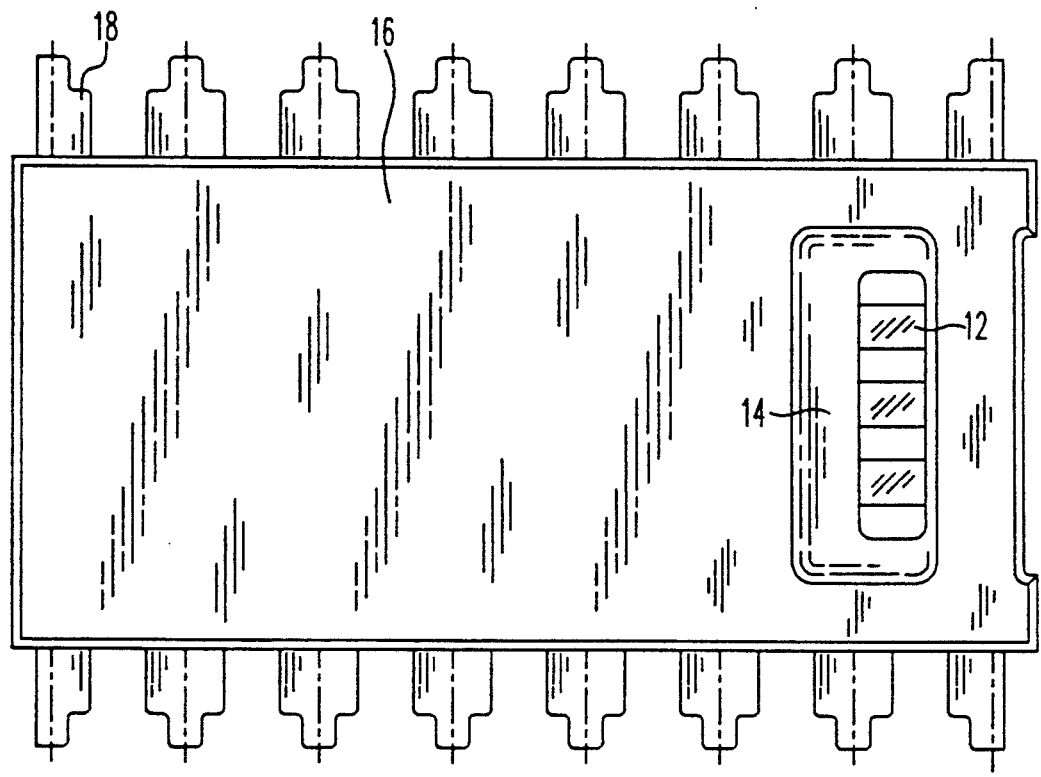
FIG. 1 is an exemplary top view of a molded dual in-line package (DIP), illustrating in particular the wirebond locations to be protected during the molding process.

FIG. 1 illustrates an exemplary molded package 10 which contains wirebond locations 12 which may be subject to being covered by resin during the molding operation. As shown, wirebond locations 12, which may comprise gold contacts, are visible through a window 14 formed in a molded package 16. Molded package 16 may comprise any suitable molding compound commonly used for molding operations, for example, a commercially available epoxy molding resins such as cresol-novolacs. As mentioned above, the molding process may result in a certain amount of the molding material, as referred to as resin, "bleeding" onto the wirebond locations. Obviously, the coating of resin over the wirebond sites will adversely affect the integrity of any subsequent wirebond attachment. Therefore, as will be described below, the present invention relates to utilizing a leadframe structure wherein the exposed wirebond sites are covered with a protective (i.e., sacrificial) layer prior to the molding process. The protective layer is then removed after the molding process, taking with it the resin coating. The clean underlying metal (e.g., virgin gold) wirebond sites are then exposed and may be used to provide electrical contacts.

Figure 2:
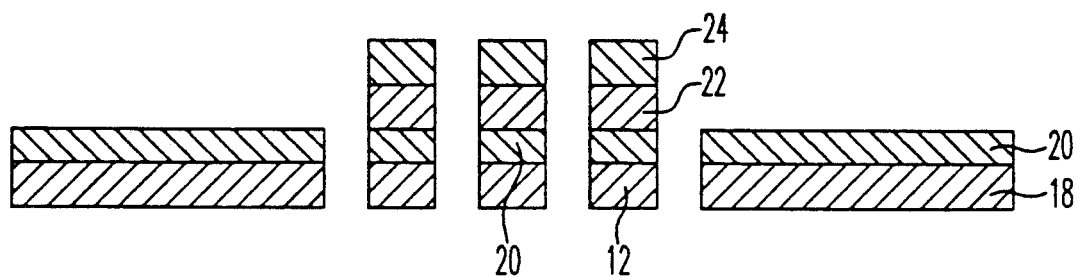
FIG. 2 is a cross-section of the leadframe and subsequent metallization portion of FIG. 1.

A cross-section of an exemplary leadframe 18, including wirebond locations 12 is illustrated in FIG. 2. Leadframe 18 may comprise any suitable material, where in most conventional embodiments, a copper alloy leadframe is used. In the conventional processing of a leadframe, the copper leadframe may also be plated with a nickel layer 20. In some cases, nickel layer 20 may be plated with an additional metal layer, for example, silver. In accordance with the processing steps of the present invention, the locations of wirebond sites, denoted 12 in FIG. 2, are next plated with the material 22 to be used to form the bond pads for the wirebond contacts. For example, gold may be used to form plated layer 22. After the gold plating step, a protective layer 24 is plated so as to cover only layer 22. Protective layer 24 must comprise a material which may later be removed by an etch process (using an etchant which will not affect the rest of the nickel-plated copper leadframe 18, underlying contact layer 22, or plastic/epoxy resin). In one embodiment, copper may be used to form protective plating layer 24.

Figure 3:
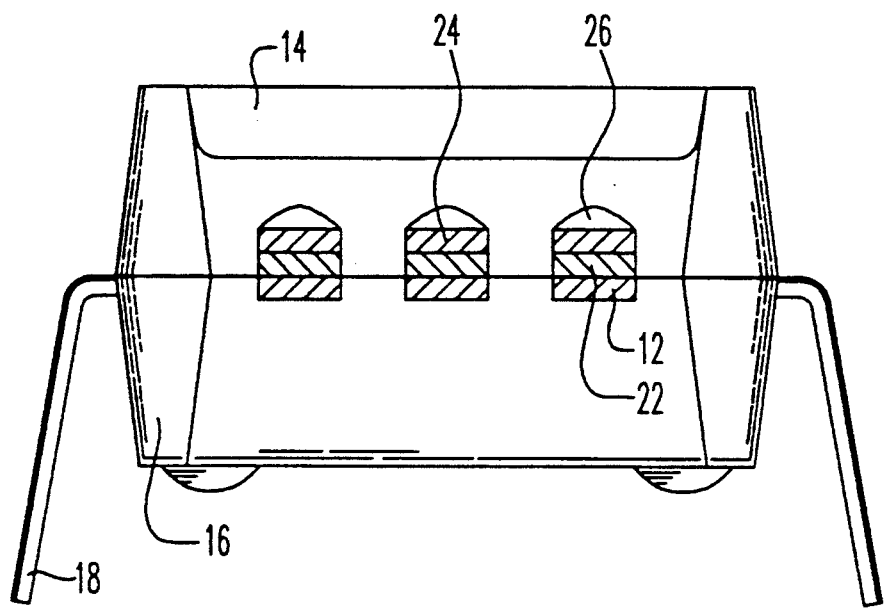
FIG. 3 illustrates the plating steps of the process of the exemplary invention.

Once the protective plating layer has been formed, a conventional fabrication process may be used so as to encase the leadframe and associated devices within molded housing 16. A cut-away side view of a molded package 16 including a plated leadframe 18 as discussed above is illustrated in FIG. 3. As shown, a relatively thin, porous residue 26 of the molding material (resin) has coated protective layer 24. In accordance with the teaching of the present invention, residue 26 is then removed by using an etchant which will preferentially etch protective layer 24 with respect to the remaining leadframe material. For example, when copper is used to form protective layer 24, an etchant comprising 10% ammonium hydroxide and 10% HCl.

Figure 4:
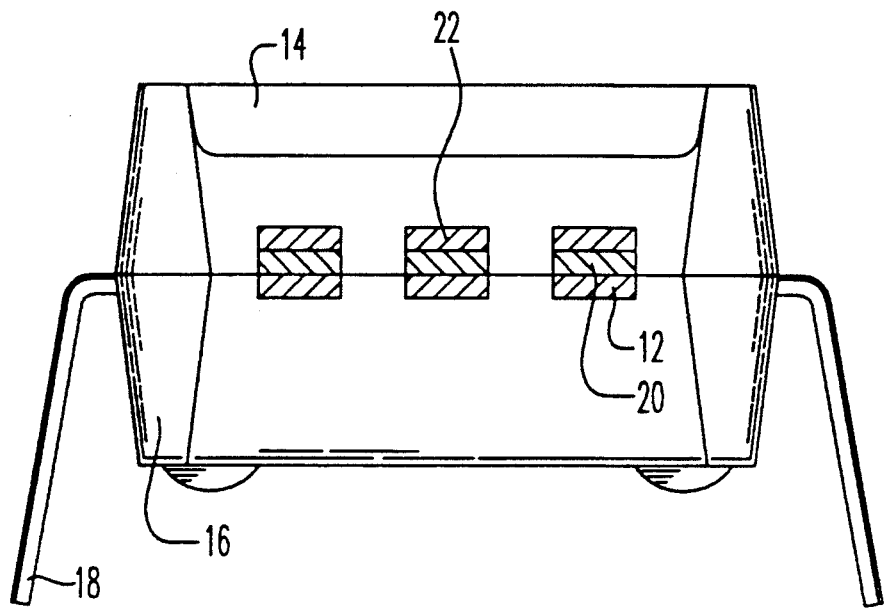
FIG. 4 is a cut-away side view of a molded DIP package, subsequent to the removal of the protective material.

FIG. 4 contains a cross-section view of an exemplary molded package after the removal of residue 26 and protective layer 24 with the etchant. As shown, the removal of these layers allows for the contact layer 22 (usually gold) to be exposed and available for wirebond attachments.

As mentioned above, various other materials (and associated etchants) may be used to form protective layer 24. For example, silver, may also be used. It is to be understood that many other materials may also be used and are considered to fall within the spirit and scope of the present invention.

I claim:

1. A method of processing a leadframe including wirebond sites for use in a molded package, the method comprising the steps of:
   a) providing a leadframe including sites for the location of wirebonds;
   b) selectively plating the wirebond sites with a suitable contact material;
   c) covering the plated contact material of step b) with a layer of protective material;
   d) performing a molding process to form said molded package; and
   e) subsequent to the molding process of step d), etching said wirebond sites with a suitable etchant for removing the protective material and exposing the underlying contact material.

2. The method as defined in claim 1 wherein in performing step b), the wirebond sites are plated with gold.

3. The method as defined in claim 1 wherein in performing step c), the contact material is covered with a layer of copper.

4. The method as defined in claim 3 wherein in performing step e), an etchant comprising essentially 10% ammonium hydroxide and 10% HCl is used.

* * * * *